United States Patent
Woetzel et al.

(10) Patent No.: US 11,676,879 B2
(45) Date of Patent: Jun. 13, 2023

(54) SEMICONDUCTOR PACKAGE HAVING A CHIP CARRIER AND A METAL PLATE SIZED INDEPENDENTLY OF THE CHIP CARRIER

(71) Applicant: Infineon Technologies AG, Neubiberg (DE)

(72) Inventors: Stefan Woetzel, Erfurt (DE); Chee Yang Ng, Johor (MY)

(73) Assignee: Infineon Technologies AG, Neubiberg (DE)

( * ) Notice: Subject to any disclaimer, the term of this patent is extended or adjusted under 35 U.S.C. 154(b) by 222 days.

(21) Appl. No.: 17/034,109

(22) Filed: Sep. 28, 2020

(65) Prior Publication Data

US 2022/0102235 A1    Mar. 31, 2022

(51) Int. Cl.
| | |
|---|---|
| H01L 23/367 | (2006.01) |
| H01L 21/48 | (2006.01) |
| H01L 21/56 | (2006.01) |
| H01L 21/78 | (2006.01) |
| H01L 23/29 | (2006.01) |
| H01L 23/31 | (2006.01) |
| H01L 23/495 | (2006.01) |
| H01L 23/498 | (2006.01) |
| H01L 23/00 | (2006.01) |

(52) U.S. Cl.
CPC ........ *H01L 23/367* (2013.01); *H01L 21/4871* (2013.01); *H01L 21/565* (2013.01); *H01L 21/78* (2013.01); *H01L 23/296* (2013.01); *H01L 23/3121* (2013.01); *H01L 23/3128* (2013.01); *H01L 23/49562* (2013.01); *H01L 23/49568* (2013.01); *H01L 23/49844* (2013.01); *H01L 24/32* (2013.01); *H01L 2224/32155* (2013.01); *H01L 2224/32175* (2013.01); *H01L 2924/0715* (2013.01); *H01L 2924/1033* (2013.01);
(Continued)

(58) Field of Classification Search
CPC ... H01L 21/4871; H01L 21/565; H01L 21/78; H01L 24/32; H01L 23/367; H01L 23/296; H01L 23/3121; H01L 23/49562; H01L 23/49844; H01L 2924/181; H01L 24/17; H01L 23/3128; H01L 23/49568
See application file for complete search history.

(56) References Cited

U.S. PATENT DOCUMENTS

| | | | |
|---|---|---|---|
| 7,064,429 B2 * | 6/2006 | Bemmerl | H01L 23/3128 257/713 |
| 2008/0105966 A1 * | 5/2008 | Beer | H01L 23/552 257/E23.114 |

(Continued)

FOREIGN PATENT DOCUMENTS

DE    10324615 A1 *    9/2004    ........... H01L 21/561

*Primary Examiner* — Alonzo Chambliss
(74) *Attorney, Agent, or Firm* — Murphy, Bilak & Homiller, PLLC

(57) ABSTRACT

A semiconductor package includes: a carrier having a first side and a second side opposite the first side, the first side having a plurality of contact structures; a semiconductor die having a first side and a second side opposite the first side, the first side of the semiconductor die having a plurality of pads attached to the plurality of contact structures at the first side of the carrier; a metal plate attached to the second side of the semiconductor die, the metal plate having a size that is independent of the size of the carrier and based on an expected thermal load to be presented by the semiconductor die; and an encapsulant confined by the carrier and the metal plate and laterally surrounding an edge of the semiconductor die. Corresponding methods of production are also provided.

19 Claims, 12 Drawing Sheets

(52) U.S. Cl.
CPC .............. *H01L 2924/10253* (2013.01); *H01L 2924/10272* (2013.01); *H01L 2924/10329* (2013.01); *H01L 2924/13055* (2013.01); *H01L 2924/13064* (2013.01); *H01L 2924/13091* (2013.01); *H01L 2924/15724* (2013.01); *H01L 2924/15747* (2013.01); *H01L 2924/15763* (2013.01); *H01L 2924/181* (2013.01); *H01L 2924/1815* (2013.01)

(56) References Cited

U.S. PATENT DOCUMENTS

| | | | | |
|---|---|---|---|---|
| 2011/0109287 A1* | 5/2011 | Nakamura | .......... | H01L 23/3107 323/282 |
| 2012/0119346 A1* | 5/2012 | Im | .......... | H01L 21/563 257/E23.18 |
| 2013/0270684 A1* | 10/2013 | Negishi | .......... | H01L 24/27 174/257 |
| 2014/0264339 A1* | 9/2014 | Kim | .......... | F25B 21/02 62/3.7 |
| 2014/0264813 A1* | 9/2014 | Lin | .......... | H01L 23/562 257/690 |
| 2015/0171026 A1* | 6/2015 | Terai | .......... | H01L 23/49579 257/77 |
| 2015/0235989 A1* | 8/2015 | Yu | .......... | H01L 25/105 257/773 |
| 2015/0255429 A1* | 9/2015 | Katkar | .......... | H01L 21/76898 257/774 |
| 2015/0380387 A1* | 12/2015 | Ben Jamaa | .......... | H01L 23/473 257/713 |
| 2019/0157448 A1* | 5/2019 | Takashima | .......... | H01L 29/045 |

* cited by examiner

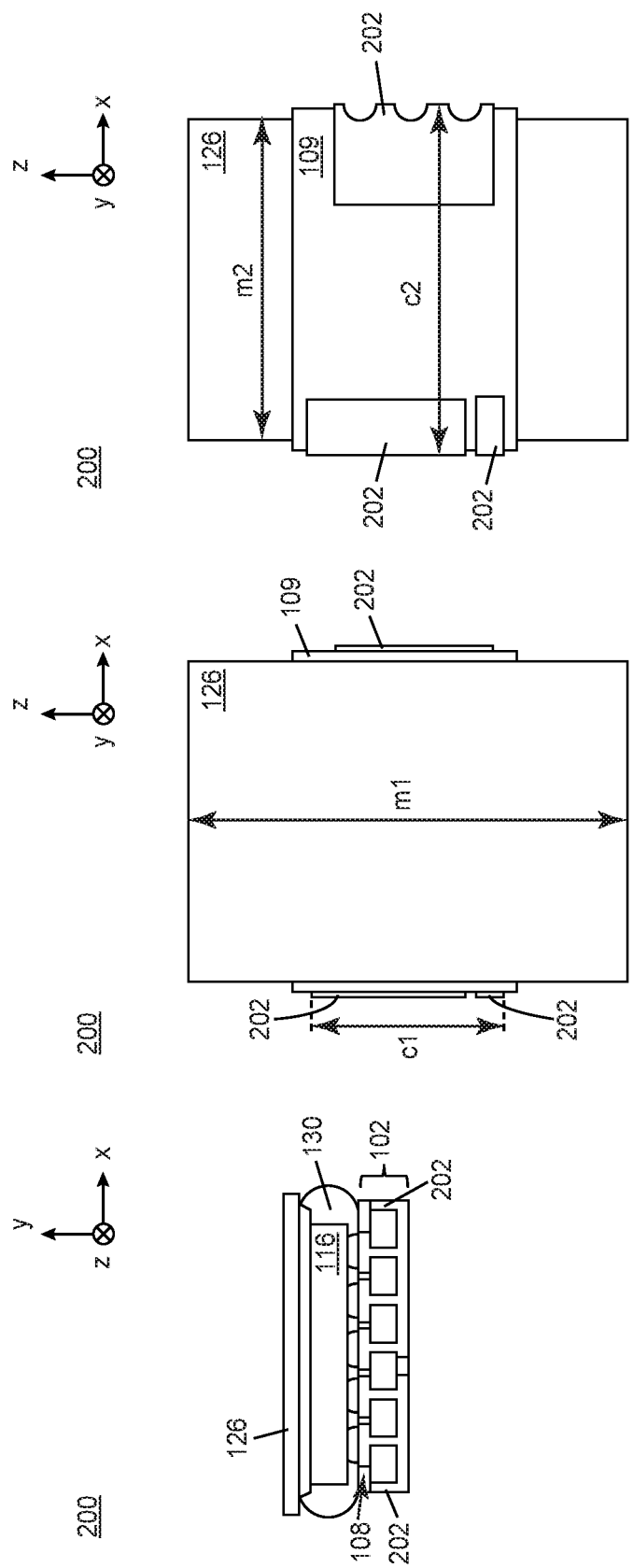

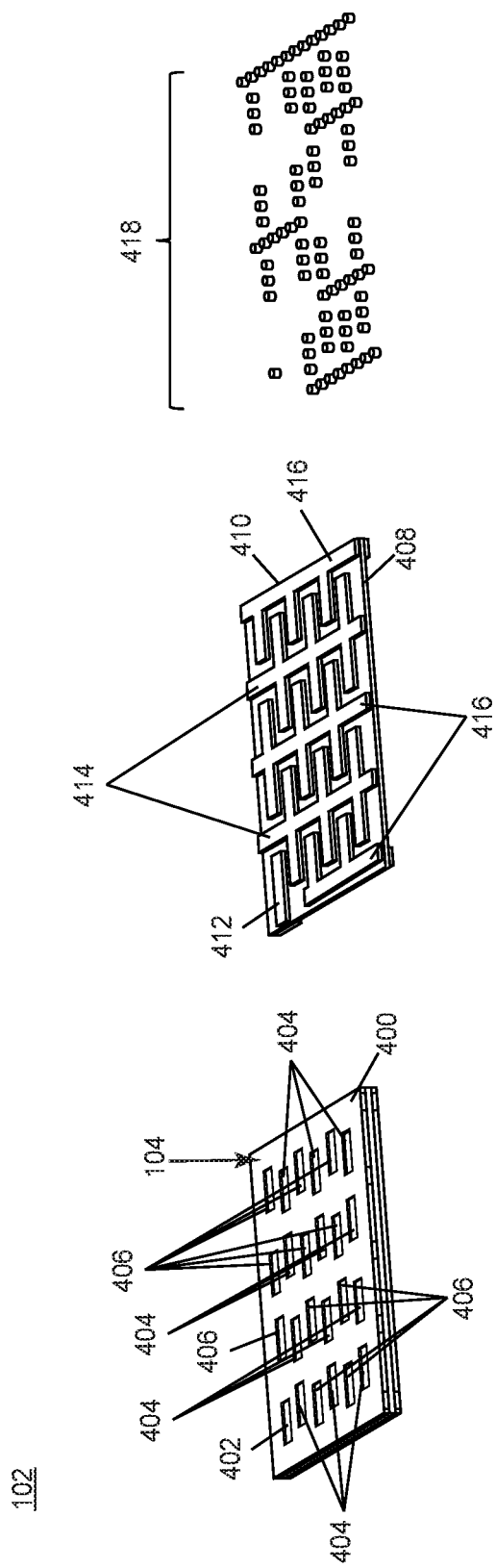

SEMICONDUCTOR PACKAGE HAVING A CHIP CARRIER AND A METAL PLATE SIZED INDEPENDENTLY OF THE CHIP CARRIER

BACKGROUND

Cooling of semiconductor packages is a challenge for power applications. The challenge increases with high temperature compound semiconductors such as GaN and SiC. Without sufficient cooling, the full performance and potential of compound semiconductors cannot be realized. Cooling performance is limited by the amount of metal (e.g. Cu) in a semiconductor package and the interconnect area/technology for chip (die) interfaces.

Chip-to-package ratio is another parameter that is often not optimized, especially for high voltage applications where creepage distance requirements tend to yield larger packages. This issue worsens for compound semiconductors such as GaN and SiC where with higher efficiency, chip size may shrink. However, creepage distance must be maintained. This results in a less than optimum chip to package ratio.

Thus, there is a need for a power semiconductor package technology offering more optimum cooling and chip-to-package ratios.

SUMMARY

According to an embodiment of a semiconductor package, the semiconductor package comprises: a carrier having a first side and a second side opposite the first side, the first side having a plurality of contact structures; a semiconductor die having a first side and a second side opposite the first side, the first side of the semiconductor die having a plurality of pads attached to the plurality of contact structures at the first side of the carrier; a metal plate attached to the second side of the semiconductor die, the metal plate having a size that is independent of the size of the carrier and based on an expected thermal load to be presented by the semiconductor die; and an encapsulant confined by the carrier and the metal plate and laterally surrounding an edge of the semiconductor die.

According to an embodiment of a method, the method comprises: providing a carrier sheet having a plurality of carriers interconnected to one another, each one of the carriers having a first side and a second side opposite the first side, the first side having a plurality of contact structures; attaching a semiconductor die to each one of the carriers, each semiconductor die having a first side and a second side opposite the first side, the first side of each semiconductor die having a plurality of pads attached to the plurality of contact structures at the first side of the corresponding carrier; after attaching the semiconductor dies, singulating the carrier sheet into separate partial packages, each one of the partial packages including one of the carriers and the semiconductor die attached to that carrier; attaching a metal sheet to the second side of the semiconductor dies of the partial packages, the partial packages being interconnected by the metal sheet; dispensing an encapsulant onto the metal sheet and around an edge of each one of the semiconductor dies; curing the encapsulant; and severing the metal sheet between adjacent ones of the semiconductor dies to form whole semiconductor packages, each one of the whole semiconductor packages having a metal plate severed from the metal sheet and having a size that is independent of the size of the carrier included in the whole semiconductor package and based on an expected thermal load to be presented by the semiconductor die included in the whole semiconductor package.

According to another embodiment of a semiconductor package, the semiconductor package comprises: a carrier having a first side and a second side opposite the first side, the first side having a plurality of contact structures; a vertical power semiconductor die having a first side and a second side opposite the first side, the first side of the vertical power semiconductor die having a source pad attached to one or more first ones of the contact structures at the first side of the carrier and a gate pad attached to a second one of the contact structures at the first side of the carrier, the second side of the vertical power semiconductor die having a drain pad; a substrate having a first patterned metallization at a first side of an electrically insulating substrate and a second patterned metallization at a second side of the electrically insulating substrate opposite the first side, the first patterned metallization being attached to the drain pad at the second side of the vertical power semiconductor die, the substrate having a size that is independent of the size of the carrier and based on an expected thermal load to be presented by the vertical power semiconductor die; and an encapsulant confined by the carrier and the substrate and laterally surrounding an edge of the vertical power semiconductor die.

According to another embodiment of a semiconductor package, the semiconductor package comprises: a carrier having a first side and a second side opposite the first side, the first side having a plurality of contact structures; a semiconductor die having a first side and a second side opposite the first side, the first side of the semiconductor die having a plurality of pads attached to the plurality of contact structures at the first side of the carrier; a metal plate attached to the second side of the semiconductor die; and an encapsulant confined by the carrier and the metal plate and laterally surrounding an edge of the semiconductor die, wherein a dimension of the metal plate in a first direction of a two-dimensional plane parallel to the metal plate and the carrier is greater than a dimension of the carrier in the first direction, wherein a dimension of the metal plate in a second direction in the two-dimensional plane perpendicular to the first dimension is greater than or less than a dimension of the carrier in the second direction.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIGS. 2A through 2C illustrate different views of another embodiment of a semiconductor package.

FIGS. 4A through 4C illustrate perspective views of a chip carrier at different levels of assembly.

DETAILED DESCRIPTION

The embodiments described herein provide a semiconductor package that includes a chip (die) carrier and a metal plate having a size that is independent of the chip carrier size and instead based on an expected thermal load to be presented by each semiconductor die attached to the chip carrier. The terms 'die' and 'chip' are used interchangeably herein to refer to an electronic device or circuit formed on a piece of semiconductor material. The metal plate may have a larger footprint and/or different size than the chip carrier. Chip carriers tend to be more expensive than metal plates, so the size of the chip carrier may be limited to reduce overall cost of the package without adversely impacting the design and size of the metal plate. Accordingly, the sizes of the chip carrier and metal plate are independent and the metal plate may be designed to optimize the thermal performance of the semiconductor package.

Described next, with reference to the figures, are exemplary embodiments of power semiconductor modules.

Figure 1:
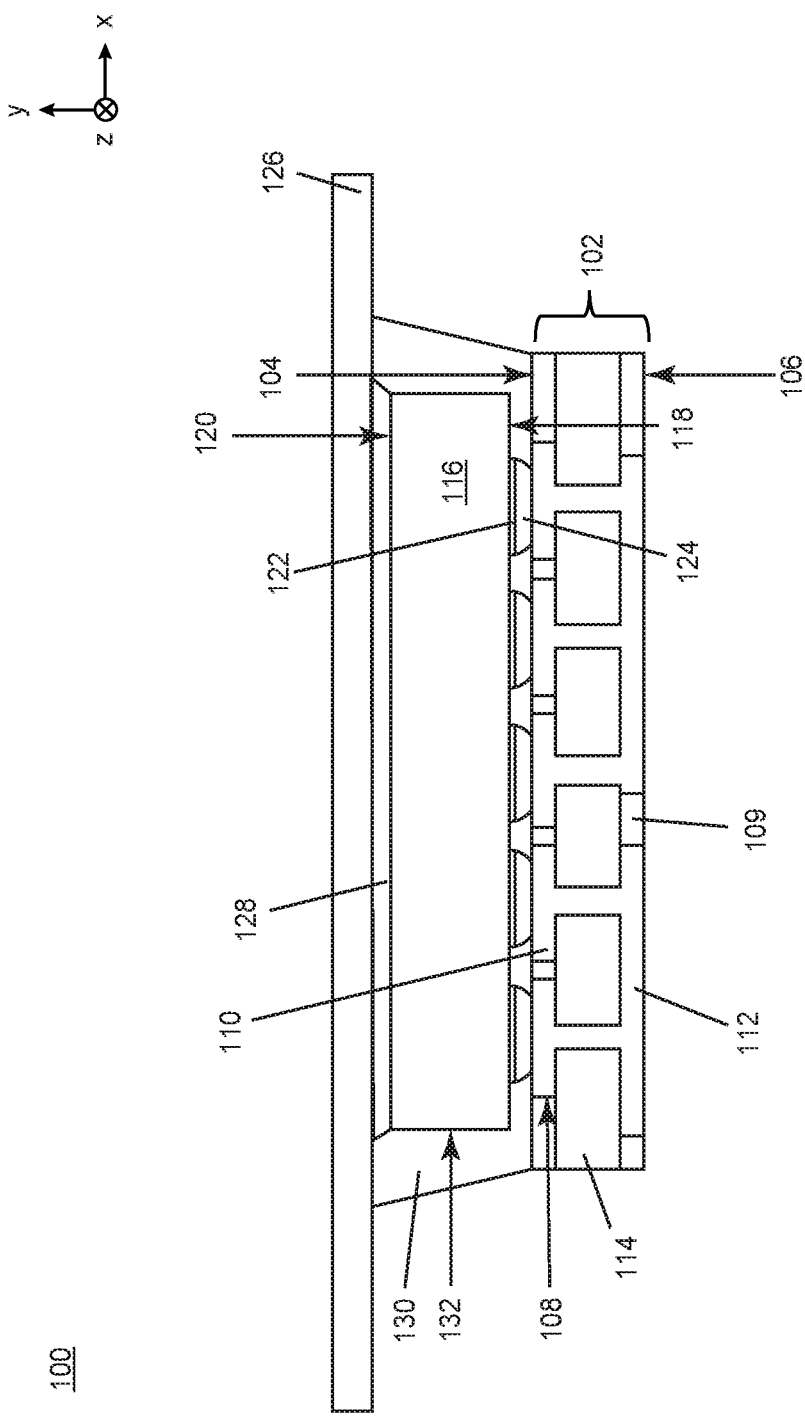
FIG. 1 illustrates a cross-sectional view of a semiconductor package.

FIG. 1 illustrates a cross-sectional view of a semiconductor package 100. The semiconductor package 100 includes a chip carrier 102 having a first side 104 and a second side 106 opposite the first side 104. The first side 104 of the chip carrier 102 has contact structures 108. The chip carrier 102 may be a circuit board such as a single or multi-layer PCB (printed circuit board), a lead frame, a DCB (direct copper bonded) substrate, an AMB (active metal brazed) substrate, an IMS (insulated metal substrate), etc. For example, in the case of a DCB substrate, the carrier 102 may include a sheet of copper 110, 112 bonded to one or both sides 104, 106 of a ceramic base 114. Each copper sheet 110, 112 may be patterned or un-patterned. For example, the top copper sheet 110 may patterned into the contact structures 108 at the first side 104 of the chip carrier 102. The contact structures 108 may include bond pads or similar structures. The contact structures 108 may also include metal traces for providing signal redistribution at the first side 104 of the chip carrier 102. A solder mask 109 may be provided at one or both sides 104, 106 of the chip carrier 102. In the case of a low-complexity chip (die) pad layout, e.g., such as source and gate pads at one die side and a drain pad at the opposite die side, the chip carrier 102 may be a lead frame and the contact structures 108 may be formed by leads of the lead frame. In this case, one or more first leads of the lead frame may be attached to a source pad of a die and at least one additional lead of the lead frame may be attached to a gate pad of the die.

The chip carrier 102 may provide signal routing between the first side 104 and the second side 106 of the carrier 102. For example, in the case of a PCB, the chip carrier 102 may have a patterned metal layer 110 at the first side 104 of the circuit board and that forms the plurality of contact structures 108. The circuit board may also have a patterned metal layer 112 at the second side 106 of the circuit board that is patterned differently than the patterned metal layer 110 at the first side 104 of the circuit board. The patterned metal layer 112 at the second side 106 of the circuit board may be configured to accommodate a land pattern of a circuit board to which the semiconductor package 100 is to be attached. The land pattern includes the pads of the circuit board to which the semiconductor package 100 is to be soldered.

The semiconductor package 100 further includes at least one semiconductor die 116 attached to the chip carrier 102. The semiconductor die 116 has a first side 118 and a second side 120 opposite the first side 118. The first side 118 of the semiconductor die 116 has (contact) pads 122 attached to the contact structures 108 at the first side 104 of the chip carrier 102. The die pads 122 may be attached to the carrier contact structures 108 by a die attach material 124 such as solder paste, sinter paste, glue, etc.

In the case of a lateral device, all power and signal connections to the semiconductor die 116 are made via the die pads 122 at the first side 118 of the die 116. For example, in the case of a lateral GaN power HEMT (high-electron-mobility transistor), source, drain and gate connections are made via the die pads 122 at the first side 118 of the die 116. In the case of a vertical device, some power and possibly even signal connections to the semiconductor die 116 are made at the second side 120 of the die 116. For example, in the case of a vertical power MOSFET (metal-oxide-semiconductor field effect transistor) or vertical IGBT (insulated gate bipolar transistor), for example a Si, SiC or other semiconductor device, source/emitter and gate connections are made via the die pads 122 at the first side 118 of the die 116 and the drain/collector connection is made at the second side 120 of the die 116.

More than one semiconductor die 116 may be attached to the chip carrier 102 and the package 100 may include more than one chip carrier 102. For example, power transistors and/or power diodes may be electrically connected in a half bridge or full bridge configuration within the package 100. In this example, the semiconductor package 100 is configured as a power rectifier. However, this is just an example. Each semiconductor die 116 included in the package 100 may be electrically connected within and/or outside the package 100 to form any type of circuit or part of a circuit.

The semiconductor package 100 also includes a metal plate 126 attached to the second side 120 of the semiconductor die 116. The metal plate 126 may be attached to the second side 120 of the semiconductor die 116 by a joining material 128 such as solder paste, sinter paste, a thermally (and possibly electrically) conductive adhesive, etc. An encapsulant 130 is confined by the chip carrier 102 and the metal plate 126, and laterally surrounds an edge 132 of the semiconductor die 116.

The metal plate 126 has a size that is independent of the size of the chip carrier 102 and instead based on an expected thermal load to be presented by each semiconductor die 116 attached to the chip carrier 102. In one embodiment, a dimension of the metal plate 126 in a first direction (the x or z direction in FIG. 1) of a two-dimensional plane parallel to the metal plate 126 and the chip carrier 102 is greater than a dimension of the chip carrier 102 in the first direction. A dimension of the metal plate 126 in a second direction (the other one of the x or z direction in FIG. 1) in the two-dimensional plane perpendicular to the first dimension is greater than or less than a dimension of the chip carrier 102 in the second direction. The two-dimensional plane in FIG. 1 is defined by the x and z directions.

In one embodiment, the metal plate 126 is a piece of stamped copper metal. However, other metals or metal alloys may be used such as Al, AlSiCu, etc.

Separately or in addition, the metal plate 126 may be larger than both the semiconductor die 116 and the chip carrier 102.

Separately or in addition, the encapsulant 130 may comprise silicone, a bismaleimide triazine (BT) epoxy or other type of epoxy, any polymer material having an operating temperature of at least 175° C., e.g., 200° C. or higher, etc. On the other hand, mold compounds typically have an operating temperature of 150° C. or less. An example of a silicon-based material that may be suitable as the encapsulant 130 and has a high melting point is a glob top material. The encapsulant 130 may have a relatively low modulus (soft) compared to a mold compound. For CTE (coefficient of thermal expansion) mismatch or thermal mechanical stress, the encapsulant 130 absorbs most of the stress. That is, the encapsulant 130 may have a relatively high CTE and relatively low modulus.

Separately or in addition, the semiconductor material of the semiconductor die 116 may be formed from a single semiconductor species such as Si or may be a compound semiconductor such as GaN, SiC, GaAs, etc.

FIGS. 2A through 2C illustrate different views of another embodiment of a semiconductor package 200 that includes a chip carrier 102 and a metal plate 126 having a size that is independent of the chip carrier size and instead based on an expected thermal load to be presented by each semiconductor die 116 attached to the chip carrier 102. FIG. 2A shows a cross-sectional view of the package 200, FIG. 2B shows a top plan view of the package 200, and FIG. 2C shows a bottom plan view of the package 200.

According to the embodiment illustrated in FIGS. 2A through 2C, a dimension (m1) of the metal plate 126 in a first direction (z-direction) of a two-dimensional plane is greater than a dimension (c1) of the chip carrier 102 in the first direction. A dimension (m2) of the metal plate 126 in a second direction (x-direction) of the two-dimensional plane is less than a dimension (c2) of the chip carrier 102 in the second direction. The second direction (x-direction) is perpendicular to the first direction (z-direction), and the two-dimensional plane is parallel to the metal plate 126 and the chip carrier 102.

Further according to the embodiment illustrated in FIGS. 2A through 2C, one or more contact structures 202 disposed around the periphery of the chip carrier 102 are at least partly visible in a plan view in which the metal plate 126 is positioned above the chip carrier 102, as illustrated in FIG. 2B. Such a contact structure configuration permits visual inspection of the joints between the periphery contact structures 202 and the board or other substrate (not shown) to which the semiconductor package 200 is eventually mounted.

Figure 3B:
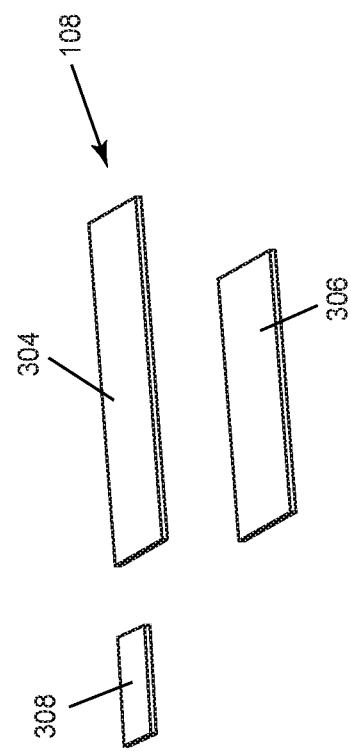
FIG. 3B illustrates a perspective view of a corresponding contact structure layout of a chip carrier for receiving the lateral power semiconductor die shown in FIG. 3A.
Figure 3A:
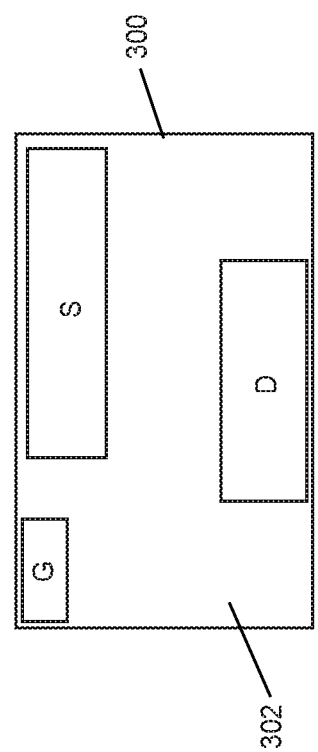
FIG. 3A illustrates a plan view of an embodiment of a lateral power semiconductor die.

FIG. 3A illustrates a plan view of an embodiment where the semiconductor die 116 shown in FIGS. 2 and 3 is a lateral power semiconductor die 300. FIG. 3B illustrates a perspective view of the corresponding contact structure layout at the first side 104 of the chip carrier 102 for receiving the lateral power semiconductor die 300 shown in FIG. 3A.

According to this embodiment, the lateral power semiconductor die 300 has a single source pad 'S', a single drain pad 'D' and a single gate pad 'G' at a first side 302 of the lateral power semiconductor die 300. The lateral power semiconductor die 300 is attached to the chip carrier 102 in a flip-chip configuration with the pads 'S', 'D', 'G' facing the contact structures 108 of the chip carrier 102.

The single source pad 'S' of the lateral power semiconductor die 300 is attached to a first one 304 of the contact structures 108 at the first side 104 of the chip carrier 102. The single drain pad 'D' of the lateral power semiconductor die 300 is attached to a second one 306 of the contact structures 108 at the first side 104 of the chip carrier 102. The single gate pad 'G' of the lateral power semiconductor die 300 is attached to a third one 308 of the contact structures 108 at the first side 104 of the chip carrier 102.

According to the embodiment illustrated in FIGS. 3A and 3B, the chip carrier 102 is implemented as a lead frame. The term 'lead frame' as used herein refers to the metal structures inside a semiconductor package that carry signals from the semiconductor die 116/300 to the outside. Lead frames may be manufactured as part of a panel, where individual lead frames are secured as units to a periphery region by connecting structures. The connecting structures are subsequently severed, e.g., after molding to yield individual packages. The semiconductor package 300 may include more than one lead frame, depending on the type of device(s) included in the package 300.

In FIG. 3B, the first one 304 of the contact structures 108 of the chip carrier 102 is a first lead of the lead frame. The second one 306 of the contact structures 108 is a second lead of the lead frame. The third one 308 of the contact structures 108 is a third lead of the lead frame.

The chip carrier configuration shown in FIGS. 3A and 3B may be used to accommodate a lateral power semiconductor die in that all power (e.g. source and drain) and signal (e.g. gate) pads of the die are disposed at the same side of the die. In this case, the first lead 304 of the lead frame may be attached to a source pad of the die, the second lead 306 of the lead frame may be attached to a drain pad of the die, and the third lead 308 of the lead frame may be attached to a gate pad of the die all at the same side of the die. In the case of a vertical power semiconductor die where the primary current path is between opposite sides of the die, the power terminals are disposed at opposite sides of the die. In this case, the first and second leads 304, 306 of the lead frame may be attached to a source pad of the die and the third lead 308 of the lead frame may be attached to a gate pad of the die. The drain connection to the die is provided by the metal plate 126 in this vertical device example.

Other types of chip carriers may be used, as previously described herein. The type of chip carrier may depend on the types of devices included in the package and the type of application for which the package is designed.

FIGS. 4A through 4C illustrate perspective views of the chip carrier 102 at different levels of assembly, according to an embodiment. FIG. 4A shows the chip carrier 102 fully assembled. According to this embodiment, the chip carrier 102 is implemented as a circuit board such as a single or multi-layer PCB. A solder mask 400 may be applied to the front side 104 of the chip carrier 102. A die attach material (not shown) such as solder paste, sinter paste, glue, etc. may be applied to the contact structures 108 at the first side 104 of the chip carrier 102. The die attach material may be applied by a printing process such as stencil or screen printing or a dispensing or jetting process, etc.

The chip carrier embodiment shown in FIGS. 4A through 4C is more complex than the chip carrier embodiment shown in FIG. 3B. However, the chip carrier embodiment shown in FIGS. 4A through 4C may accommodate the same type of semiconductor die that can be accommodated by the chip carrier embodiment shown in FIG. 3B, but with a more sophisticated contact pad configuration.

For example, a first one 402 of the contact structures 108 at the first side 104 of the chip carrier 102 may be configured for attachment to a gate pad of a lateral power transistor die.

A group of second ones 404 of the contact structures 108 at the first side 104 of the chip carrier 102 may be configured for attachment to respective source pads of the lateral power transistor die. A group of third ones 406 of the contact structures 108 at the first side 104 of the chip carrier 102 may be configured for attachment to respective drain pads of the lateral power transistor die.

FIG. 4B shows the chip carrier 102 with the solder mask 400 removed, exposing an underlying electrically insulative substrate 408. A metallization layer 410 is patterned into three separate sections 412, 414, 416. The first section 412 is connected to the gate contact structure 402 at the first side 104 of the chip carrier 102. The second section 414 is connected to the source contact structures 404 at the first side 104 of the chip carrier 102. The third section 416 is connected to the drain contact structures 406 at the first side 104 of the chip carrier 102.

FIG. 4C shows the metal vias 418 that connect the different contact structures 402, 404, 406 at the first side 104 of the chip carrier 102 to corresponding patterned metallization sections (out of view) at the second side 106 of the chip carrier 102.

A lateral power semiconductor die designed for attachment to the chip carrier 102 shown in the FIGS. 4A through 4C has a plurality of source pads, a plurality of drain pads and a gate pad at a side of the power semiconductor die to be mounted to the chip carrier 102. For example, the lateral power semiconductor die may be a lateral GaN power semiconductor die, a lateral Si power semiconductor die, a lateral SiC power semiconductor die, etc. During package assembly, the source pads of the lateral power semiconductor die are attached to the first group of contact structures 404 at the first side 104 of the chip carrier 102. The drain pads of the lateral power semiconductor die are attached to the second group of the contact structures 406 at the first side 104 of the chip carrier 102. The gate pad of the lateral power semiconductor die is attached to the additional contact structure 402 at the first side 104 of the chip carrier 102.

Figure 5:
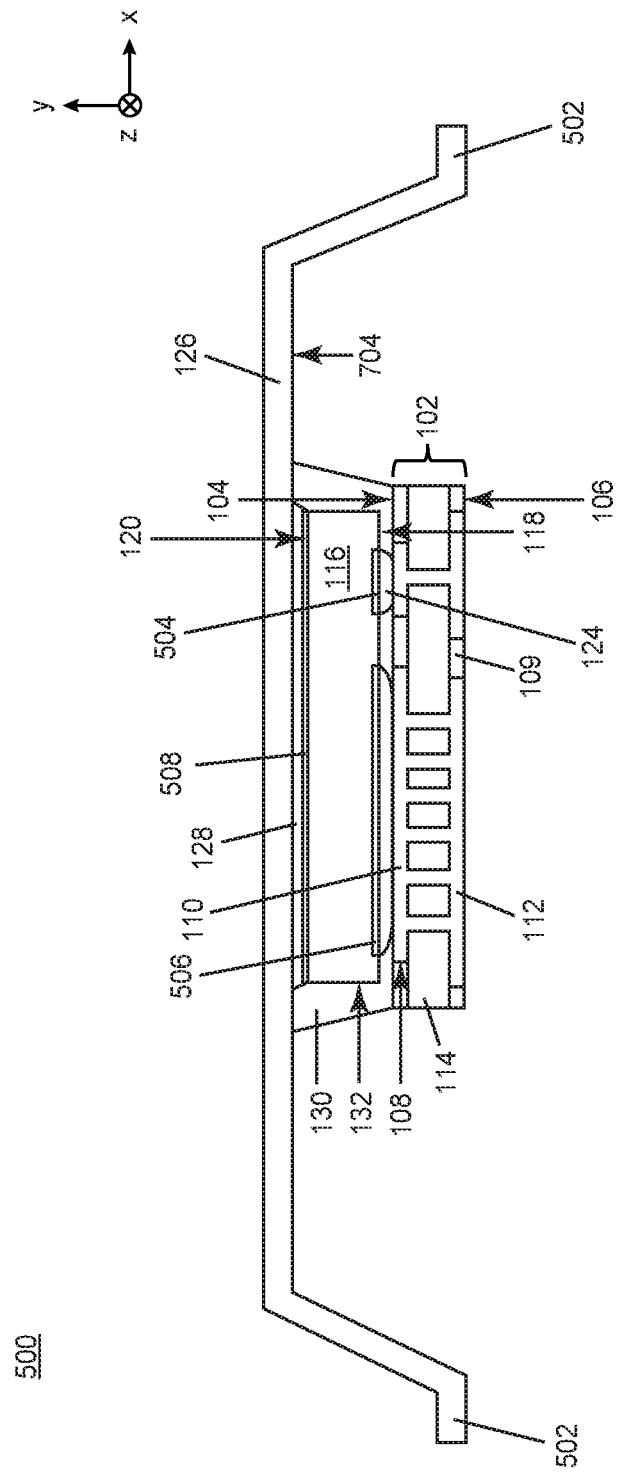
FIGS. 5 through 8 illustrate respective cross-sectional views of semiconductor packages, according to additional embodiments.

FIG. 5 illustrates a cross-sectional view of a semiconductor package 500. The embodiment shown in FIG. 5 is similar to the embodiment shown in FIG. 1. Different, however, the metal plate 126 is bent in a direction (y-direction) toward the chip carrier 102 outside a periphery of both the semiconductor die 116 and the carrier 102. Such a metal plate configuration allows for contacting or mounting of ends 502 of the metal plate 126 to another substrate such as a circuit board to which the package 500 is to be mounted. In the case of a vertical semiconductor die, a gate pad 504 and a source pad 506 at the first side 118 of the semiconductor die 116 may be attached to the contact structures 108 at the first side 104 of the chip carrier 102. A drain pad 508 at the second side 120 of the semiconductor die 116 may be attached to the metal plate 126. The drain connection to the semiconductor die 116 may be made to the application board (not shown) through one or both downward bent ends 502 of the metal plate 126.

Figure 6:
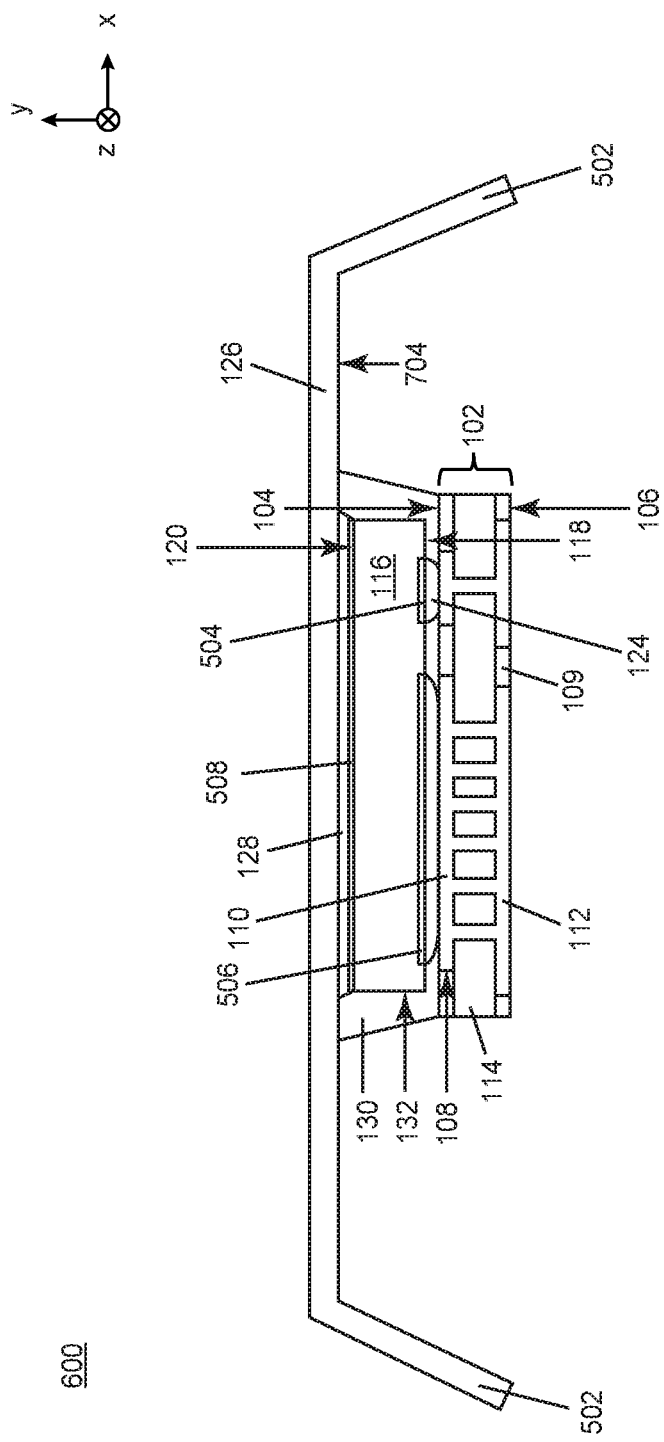

FIG. 6 illustrates a cross-sectional view of a semiconductor package 600. The embodiment shown in FIG. 6 is similar to the embodiment shown in FIG. 5. Different, however, the ends 502 of the metal plate 126 are not bent in the same way as in FIG. 5.

Figure 7:
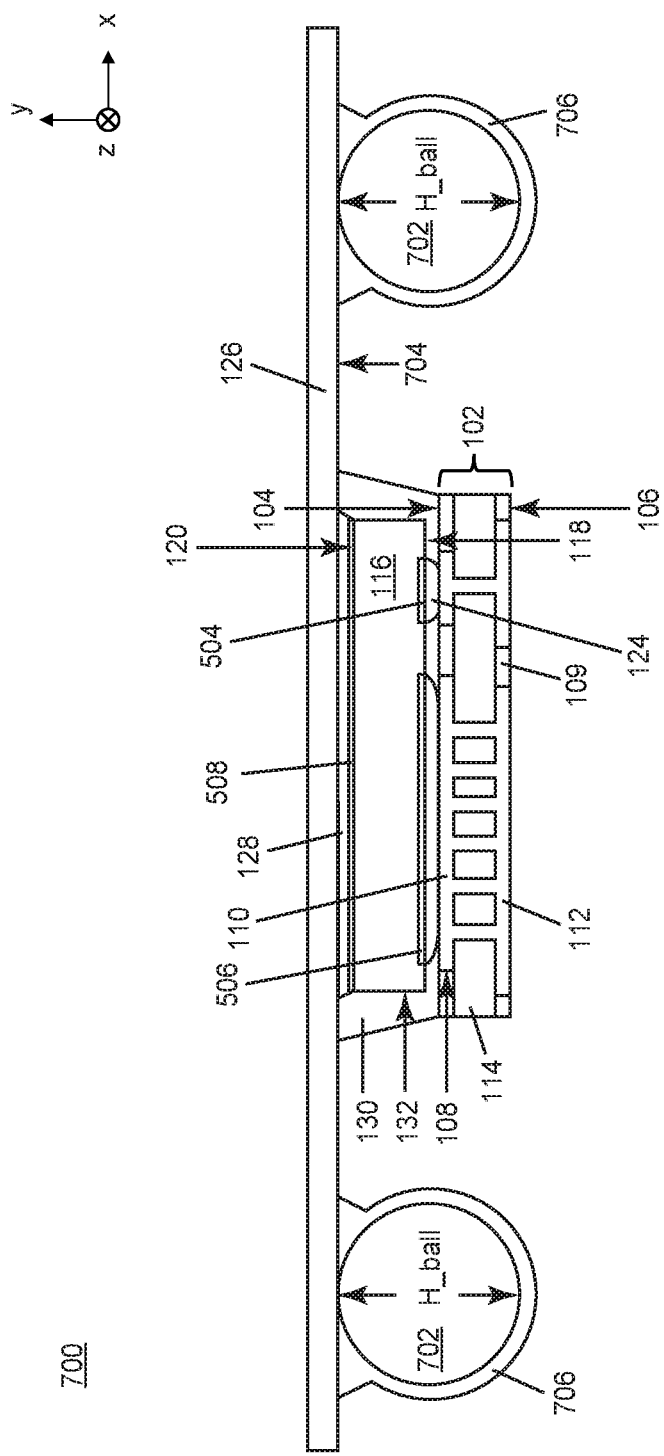

FIG. 7 illustrates a cross-sectional view of a semiconductor package 700. The embodiment shown in FIG. 7 is similar to the embodiments shown in FIGS. 5 and 6. Different, however, metal connectors 702 such as metal balls, metal blocks, metal bar, metal pillars, etc. are attached to the metal plate 126 at a side 704 of the metal plate 126 attached to the semiconductor die 116. The metal connectors 702 are laterally spaced apart from both the semiconductor die 116 and the chip carrier 102. The metal connectors 702 have a height 'H ball' that is equal to or greater than a combined height of the semiconductor die 116 and the chip carrier 102. The metal connectors 702 may be attached to the metal plate 126 via a joining material 706 such as solder paste, sinter paste, etc.

Figure 8:
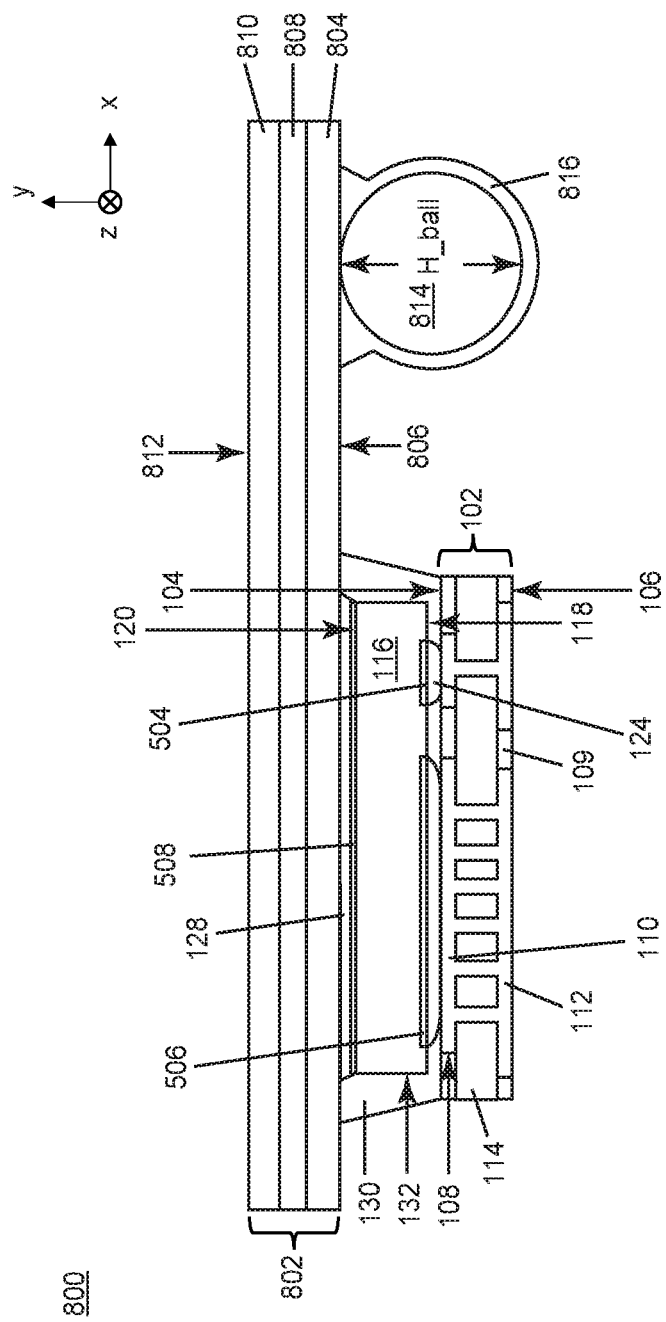

FIG. 8 illustrates a cross-sectional view of a semiconductor package 800. The semiconductor package 800 includes a chip carrier 102 having a first side 104 and a second side 106 opposite the first side 106. The first side 104 of the chip carrier 102 has contact structures 108. A vertical power semiconductor die 116 having a first side 118 and a second side 120 opposite the first side 118 is attached to the chip carrier 102. The first side 118 of the vertical power semiconductor die 116 has a source pad 506 attached to one or more first ones of the contact structures 108 at the first side 104 of the chip carrier 102 and a gate pad 504 attached to a second one of the contact structures 108 at the first side 104 of the carrier 102. The second side 120 of the vertical power semiconductor die 116 has a drain pad 508.

The semiconductor package 800 further includes a substrate 802 such as a DCB substrate having a first patterned metallization 804 at a first side 806 of an electrically insulating substrate 808 and a second patterned metallization 810 at a second side 812 of the electrically insulating substrate 808 opposite the first side 806. The first patterned metallization 804 is attached to the drain pad 508 at the second side 120 of the vertical power semiconductor die 116, e.g., via a joining material 128 such as solder paste, sinter paste, an electrically conductive adhesive, etc. The substrate 802 has a size that is independent of the size of the chip carrier 102 and instead based on an expected thermal load to be presented by the vertical power semiconductor die 116. An encapsulant 130 confined by the chip carrier 102 and the substrate 802 laterally surrounds an edge 132 of the vertical power semiconductor die 116. One or more metal connectors 814 may be attached to the first patterned metallization 804 of the substrate 802. Each metal connector 814 is laterally spaced apart from both the vertical power semiconductor die 116 and the chip carrier 102. Each metal connector 814 has a height 'H ball' that is equal to or greater than a combined height of the vertical power semiconductor die 116 and the chip carrier 102. Each metal connector 814 may be attached to the first patterned metallization 804 of the substrate 802 via a joining material 816 such as solder paste, sinter paste, etc.

Figure 9A:
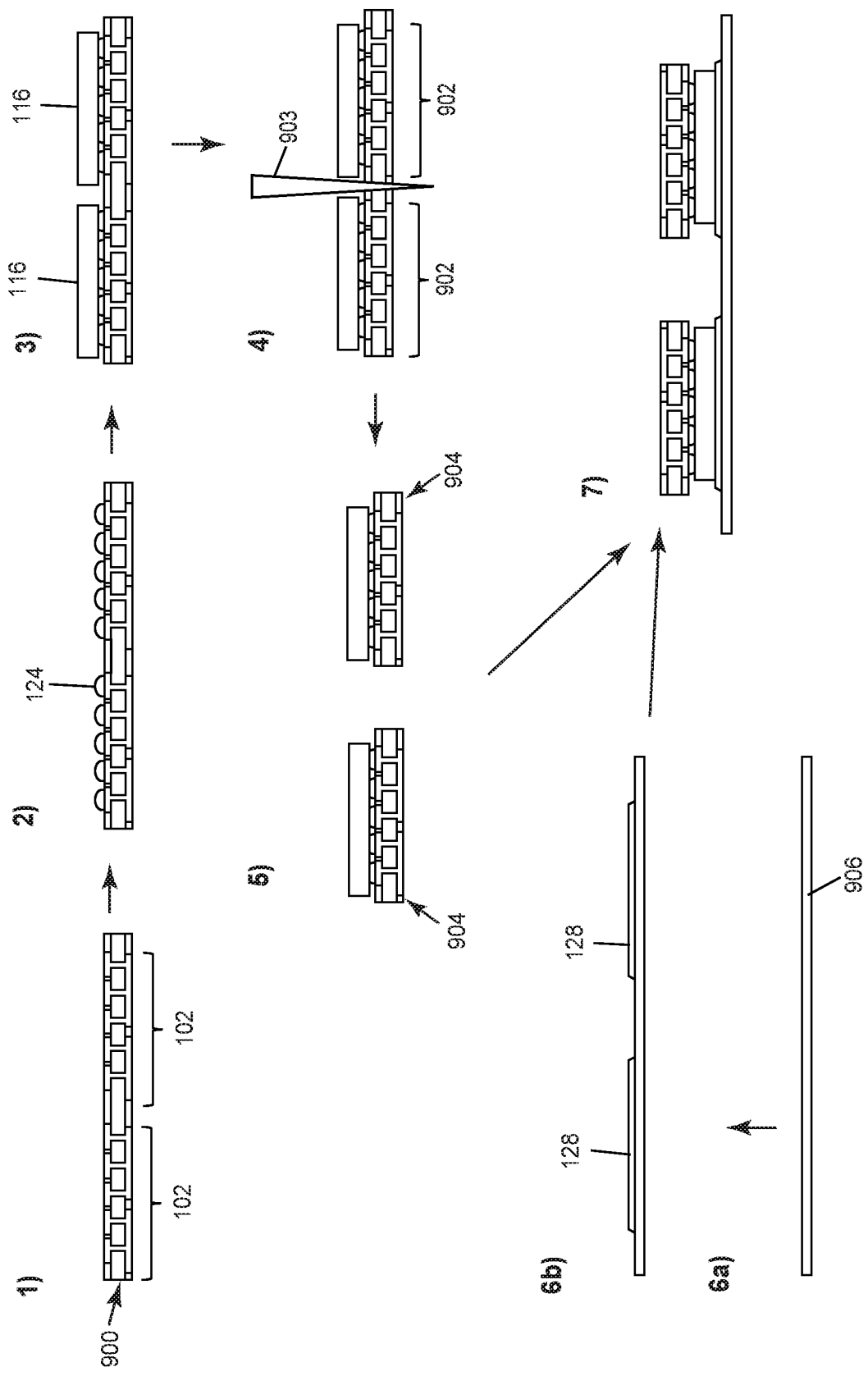
FIGS. 9A and 9B illustrate a method of producing a semiconductor package.
Figure 9B:
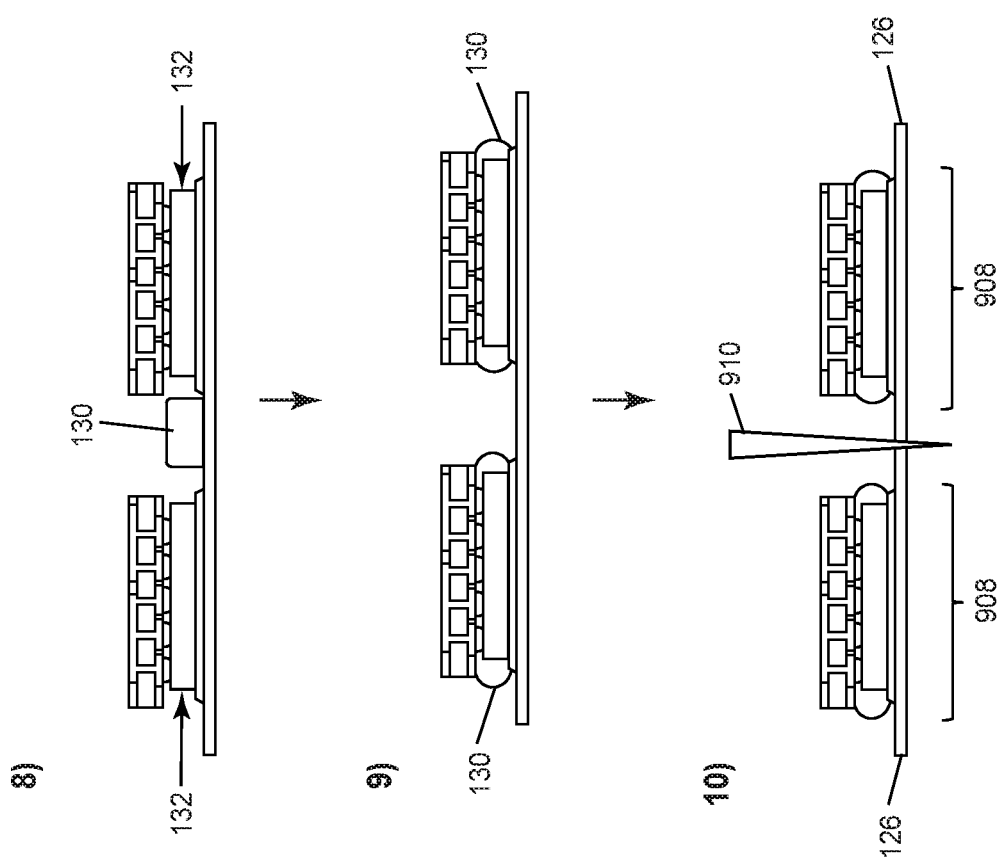

FIGS. 9A and 9B illustrates a method of producing the semiconductor packages described herein. In step 1, carrier sheet 900 is provided having a plurality of chip carriers 102 interconnected to one another. Each chip carrier 102 has a first side 104 and a second side 106 opposite the first side 104, the first side 104 having contact structures 108, as previously described herein.

In step 2, a die attach material 124 such as solder paste, sinter paste, glue, etc. is placed on the contact structures 108 of each chip carrier 102. The die attach material 124 may be applied by a printing process such as stencil or screen printing or a dispensing or jetting process, etc.

In step 3, at least one semiconductor die 116 is attached to each one of the chip carriers 102. Each semiconductor die 116 has a first side 118 and a second side 120 opposite the first side 118, the first side 118 of each semiconductor die 116 having a plurality of pads 122 attached to the contact structures 108 at the first side 104 of the corresponding carrier 102, as previously described herein.

In step 4, the carrier sheet 900 is singulated into separate partial packages 902 by a singulation process 903 such as sawing, laser cutting, stamping, etc. Each partial package 902 includes one of the chip carriers 102 and each semiconductor die 116 attached to that carrier 102.

In step 5, the singulation process is completed which results in physically separate partial semiconductor packages 904.

In step 6a, a metal sheet 906 is provided. In one embodiment, the metal sheet 906 is a Cu sheet. However, the other materials may be used for the metal sheet 906 such as Al, AlSiCu, etc.

In step 6b, a joining material 128 such as solder paste, sinter paste, a thermally (and possibly electrically) conductive adhesive, etc. is applied to the metal sheet 906.

In step 7, the metal sheet 906 is attached to the second side 120 of the semiconductor dies 116 of the partial packages 902 via the corresponding joining material 128. In the case of a solder paste as the joining material 128, the die attachment process may involve solder reflow. Regardless of the type of joining material 128 used, the partial packages 902 are interconnected by the metal sheet 906.

In step 8, an encapsulant 130 is dispensed onto the metal sheet 906 and around the edge 132 of each semiconductor die 116. The encapsulant 130 may comprise silicone, a BT epoxy or other type of epoxy, any polymer material having an operating temperature of at least 175° C., e.g., 200° C. or higher, etc.

In step 9, the encapsulant 130 is cured. The curing process depends on the type of encapsulant used. For example, the curing process may involve heating, UV curing, etc.

In step 10, the metal sheet 906 is severed between adjacent ones of the semiconductor dies 116 of different partial packages 904 to form whole semiconductor packages 908. Each one of the whole semiconductor packages 908 has a metal plate 126 severed from the metal sheet 906 and having a size that is independent of the size of the chip carrier 102 included in the whole semiconductor package 908 and instead based on an expected thermal load to be presented by each semiconductor die 116 included in the whole semiconductor package 908. The package singulation process 910 used to sever the metal sheet 906 between adjacent ones of the semiconductor dies 116 of different partial packages 904 may include sawing, laser cutting, stamping, etc.

Figure 10:
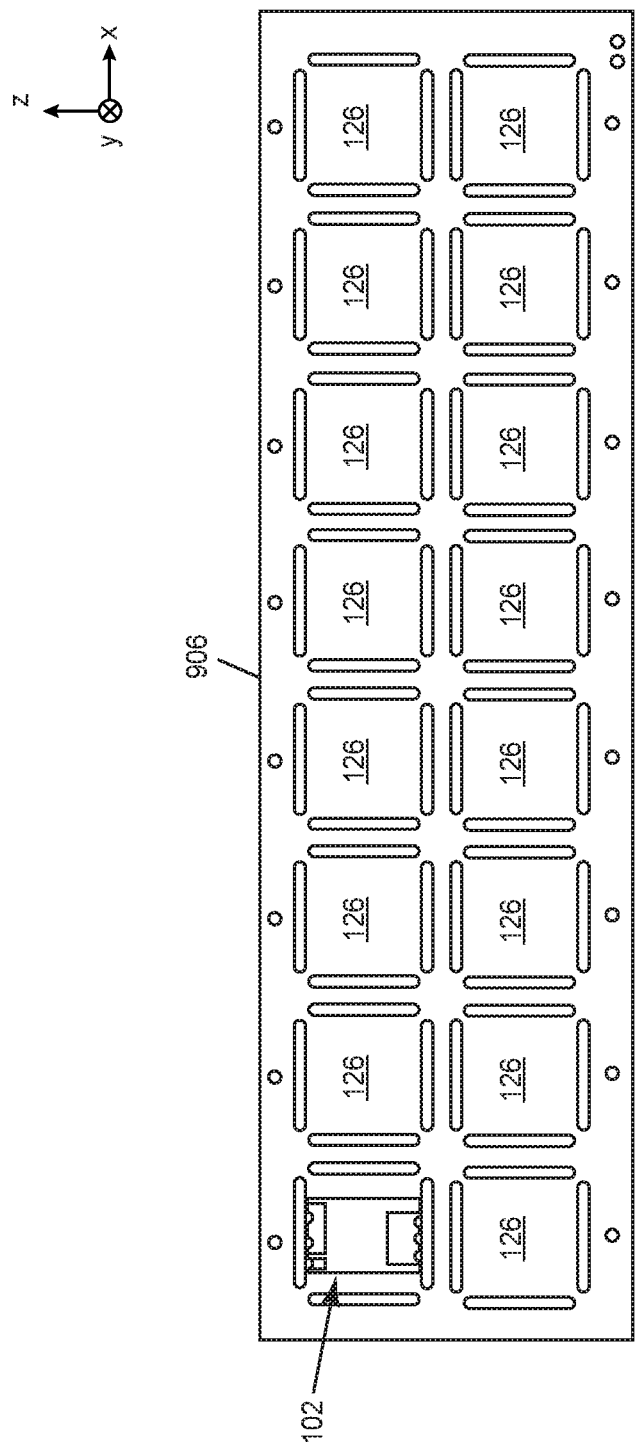
FIG. 10 illustrates a plan view of one embodiment of a metal sheet used in the method of FIGS. 9A and 9B.

FIG. 10 illustrates a plan view of one embodiment of the metal sheet 906 shown in FIGS. 9A and 9B. According to this embodiment, a dimension of each metal plate 126 in a first direction (the x direction in FIG. 10) of a two-dimensional plane parallel to the metal plate 126 and the chip carrier 102 is greater than a dimension of the chip carrier 102 in the first direction. A dimension of each metal plate 126 in a second direction (the z direction in FIG. 10) in the two-dimensional plane perpendicular to the first dimension is the same as a dimension of the chip carrier 102 in the second direction. The two-dimensional plane in FIG. 10 is defined by the x and z directions.

Figure 11:
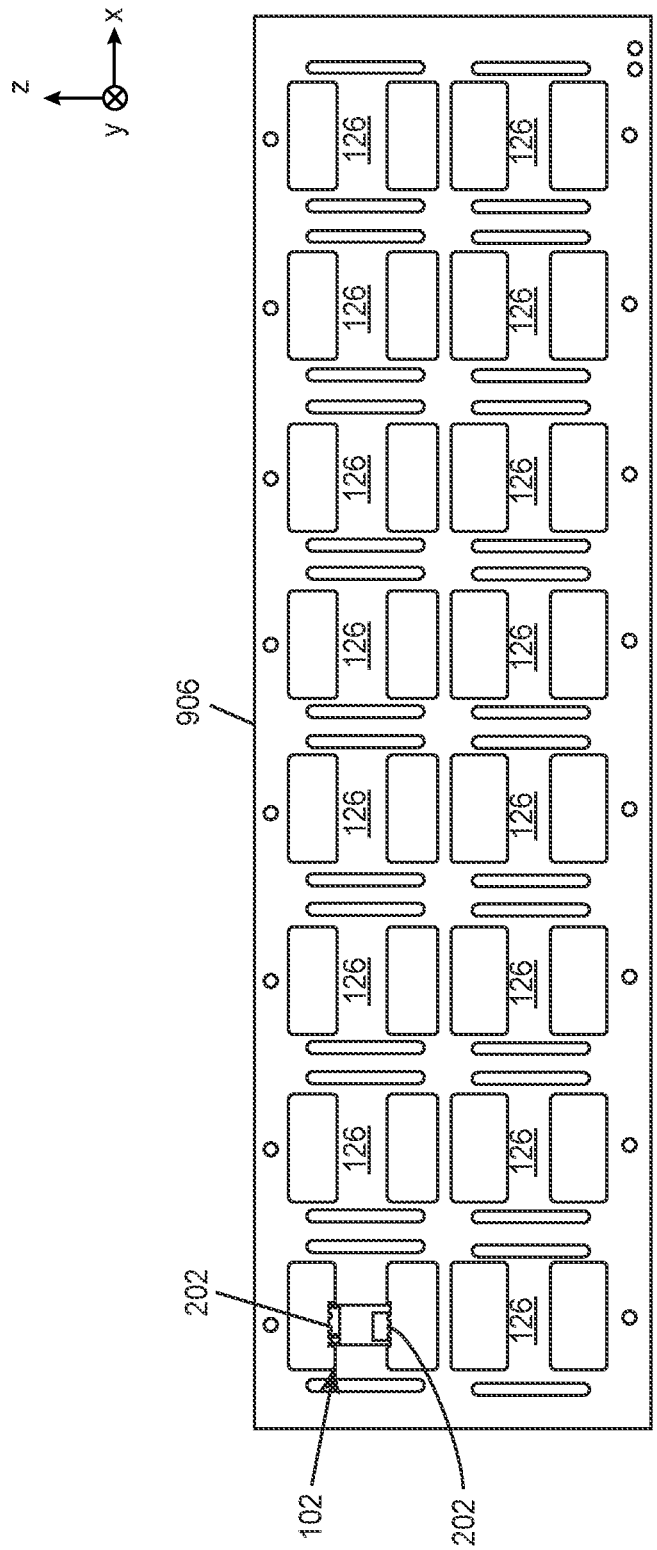
FIG. 11 illustrates a plan view of another embodiment of a metal sheet used in the method of FIGS. 9A and 9B.

FIG. 11 illustrates a plan view of another embodiment of the metal sheet 906 shown in FIGS. 9A and 9B. According to this embodiment, a dimension of each metal plate 126 in a first direction (the x direction in FIG. 10) of a two-dimensional plane parallel to the metal plate 126 and the chip carrier 102 is greater than a dimension of the chip carrier 102 in the first direction. A dimension of each metal plate 126 in a second direction (the z direction in FIG. 10) in the two-dimensional plane perpendicular to the first dimension is smaller than a dimension of the chip carrier 102 in the second direction, enabling subsequent visual inspection of the joints between the periphery contact structures 202 of each chip carrier 102 and the board or other substrate (not shown) to which each chip carrier 102 is eventually mounted. The two-dimensional plane in FIG. 11 is defined by the x and z directions.

The embodiments described herein provide a package concept that enables dual sided cooling where the package can have an oversized top metal structure for optimum cooling surface area and minimum creepage distance, if applicable. The interconnect area to chip on carrier and to chip interconnect interface may both be maximized. An encapsulant with low stress and high temperature characteristics may be used to encapsulate the die.

Although the present disclosure is not so limited, the following numbered examples demonstrate one or more aspects of the disclosure.

Example 1. A semiconductor package, comprising: a carrier having a first side and a second side opposite the first side, the first side having a plurality of contact structures; a semiconductor die having a first side and a second side opposite the first side, the first side of the semiconductor die having a plurality of pads attached to the plurality of contact structures at the first side of the carrier; a metal plate attached to the second side of the semiconductor die, the metal plate having a size that is independent of the size of the carrier and based on an expected thermal load to be presented by the semiconductor die; and an encapsulant confined by the carrier and the metal plate and laterally surrounding an edge of the semiconductor die.

Example 2. The semiconductor package of example 1, wherein a dimension of the metal plate in a first direction of a two-dimensional plane is greater than a dimension of the carrier in the first direction, wherein a dimension of the metal plate in a second direction of the two-dimensional plane is less than a dimension of the carrier in the second direction, wherein the second direction is perpendicular to the first direction, and wherein the two-dimensional plane is parallel to the metal plate and the carrier.

Example 3. The semiconductor package of example 1 or 2, wherein one or more of the contact structures disposed around a periphery of the carrier are at least partly visible in a plan view in which the metal plate is positioned above the carrier.

Example 4. The semiconductor package of any of examples 1 through 3, wherein the metal plate is a piece of stamped copper metal.

Example 5. The semiconductor package of any of examples 1 through 4, wherein the metal plate is larger than both the semiconductor die and the carrier.

Example 6. The semiconductor package of any of examples 1 through 5, wherein the encapsulant comprises silicone.

Example 7. The semiconductor package of any of examples 1 through 6, wherein the encapsulant has an operating temperature greater than 175° C.

Example 8. The semiconductor package of any of examples 1 through 7, wherein the encapsulant has an operating temperature of 200° C. or higher.

Example 9. The semiconductor package of any of examples 1 through 8, wherein the semiconductor die is a lateral power semiconductor die having a single source pad, a single drain pad and a single gate pad at the first side of the lateral power semiconductor die, wherein the single source pad is attached to a first one of the contact structures at the first side of the carrier, wherein the single drain pad is attached to a second one of the contact structures at the first side of the carrier, and wherein the single gate pad is attached to a third one of the contact structures at the first side of the carrier.

Example 10. The semiconductor package of example 9, wherein the carrier is a lead frame, wherein the first one of the contact structures is a first lead of the lead frame, wherein the second one of the contact structures is a second lead of the lead frame, and wherein the third one of the contact structures is a third lead of the lead frame.

Example 11. The semiconductor package of any of examples 1 through 8, wherein the semiconductor die is a lateral power semiconductor die having a plurality of source pads, a plurality of drain pads and a gate pad at the first side of the power semiconductor die, wherein the plurality of source pads are attached to a first group of the contact structures at the first side of the carrier, wherein the plurality of drain pads are attached to a second group of the contact structures at the first side of the carrier, and wherein the gate pad is attached to an additional one of the contact structures at the first side of the carrier.

Example 12. The semiconductor package of example 11, wherein the carrier is a circuit board having a patterned metal layer at the first side of the circuit board and that forms the first group of the contact structures, the second group of the contact structures, and the additional one of the contact structures.

Example 13. The semiconductor package of example 11 or 12, wherein the lateral power semiconductor die is a lateral GaN power semiconductor die.

Example 14. The semiconductor package of any of examples 1 through 13, wherein the carrier provides signal routing between the first side and the second side of the carrier.

Example 15. The semiconductor package of example 14, wherein the carrier is a circuit board having a patterned metal layer at the first side of the circuit board and that forms the plurality of contact structures.

Example 16. The semiconductor package of example 15, wherein the circuit board has a patterned metal layer at the second side of the circuit board that is patterned differently than the patterned metal layer at the first side of the circuit board, and wherein the patterned metal layer at the second side of the circuit board accommodates a land pattern of a circuit board to which the semiconductor package is to be attached.

Example 17. The semiconductor package of any of examples 1 through 16, wherein outside a periphery of both the semiconductor die and the carrier, the metal plate is bent in a direction toward the carrier.

Example 18. The semiconductor package of any of examples 1 through 17, further comprising metal connectors attached to the metal plate at a side of the metal plate attached to the semiconductor die, wherein the metal connectors are laterally spaced apart from both the semiconductor die and the carrier, and wherein the metal connectors have a height that is equal to or greater than a combined height of the semiconductor die and the carrier.

Example 19. A method, comprising: providing a carrier sheet having a plurality of carriers interconnected to one another, each one of the carriers having a first side and a second side opposite the first side, the first side having a plurality of contact structures; attaching a semiconductor die to each one of the carriers, each semiconductor die having a first side and a second side opposite the first side, the first side of each semiconductor die having a plurality of pads attached to the plurality of contact structures at the first side of the corresponding carrier; after attaching the semiconductor dies, singulating the carrier sheet into separate partial packages, each one of the partial packages including one of the carriers and the semiconductor die attached to that carrier; attaching a metal sheet to the second side of the semiconductor dies of the partial packages, the partial packages being interconnected by the metal sheet; dispensing an encapsulant onto the metal sheet and around an edge of each one of the semiconductor dies; curing the encapsulant; and severing the metal sheet between adjacent ones of the semiconductor dies to form whole semiconductor packages, each one of the whole semiconductor packages having a metal plate severed from the metal sheet and having a size that is independent of the size of the carrier included in the whole semiconductor package and based on an expected thermal load to be presented by the semiconductor die included in the whole semiconductor package.

Example 20. A semiconductor package, comprising: a carrier having a first side and a second side opposite the first side, the first side having a plurality of contact structures; a vertical power semiconductor die having a first side and a second side opposite the first side, the first side of the vertical power semiconductor die having a source pad attached to one or more first ones of the contact structures at the first side of the carrier and a gate pad attached to a second one of the contact structures at the first side of the carrier, the second side of the vertical power semiconductor die having a drain pad; a substrate having a first patterned metallization at a first side of an electrically insulating substrate and a second patterned metallization at a second side of the electrically insulating substrate opposite the first side, the first patterned metallization being attached to the drain pad at the second side of the vertical power semiconductor die, the substrate having a size that is independent of the size of the carrier and based on an expected thermal load to be presented by the vertical power semiconductor die; and an encapsulant confined by the carrier and the substrate and laterally surrounding an edge of the vertical power semiconductor die.

Example 21. The semiconductor package of example 20, further comprising metal connectors attached to the first patterned metallization of the substrate, wherein the metal connectors are laterally spaced apart from both the vertical power semiconductor die and the carrier, and wherein the metal connectors have a height that is equal to or greater than a combined height of the vertical power semiconductor die and the carrier.

Example 22. A semiconductor package, comprising: a carrier having a first side and a second side opposite the first side, the first side having a plurality of contact structures; a semiconductor die having a first side and a second side opposite the first side, the first side of the semiconductor die having a plurality of pads attached to the plurality of contact structures at the first side of the carrier; a metal plate attached to the second side of the semiconductor die; and an encapsulant confined by the carrier and the metal plate and laterally surrounding an edge of the semiconductor die, wherein a dimension of the metal plate in a first direction of a two-dimensional plane parallel to the metal plate and the carrier is greater than a dimension of the carrier in the first direction, wherein a dimension of the metal plate in a second direction in the two-dimensional plane perpendicular to the first dimension is greater than or less than a dimension of the carrier in the second direction.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor package, comprising:
a carrier having a first side and a second side opposite the first side, the first side having a plurality of contact structures;
a semiconductor die having a first side and a second side opposite the first side, the first side of the semiconductor die having a plurality of pads attached to the plurality of contact structures at the first side of the carrier;
a metal plate attached to the second side of the semiconductor die, the metal plate having a size that is independent of the size of the carrier and based on an expected thermal load to be presented by the semiconductor die; and
an encapsulant confined by the carrier and the metal plate and laterally surrounding an edge of the semiconductor die,
wherein outside a periphery of both the semiconductor die and the carrier, the metal plate is bent in a direction toward the carrier,
wherein a dimension of the metal plate in a first direction of a two-dimensional plane is greater than a dimension of the carrier in the first direction,
wherein a dimension of the metal plate in a second direction of the two-dimensional plane is less than a dimension of the carrier in the second direction,
wherein the second direction is perpendicular to the first direction,
wherein the two-dimensional plane is parallel to the metal plate and the carrier.

2. The semiconductor package of claim 1, wherein one or more of the contact structures disposed around a periphery of the carrier are at least partly visible in a plan view in which the metal plate is positioned above the carrier.

3. The semiconductor package of claim 1, wherein the metal plate is a piece of stamped copper metal.

4. The semiconductor package of claim 1, wherein the metal plate is larger than both the semiconductor die and the carrier.

5. The semiconductor package of claim 1, wherein the encapsulant comprises silicone.

6. The semiconductor package of claim 1, wherein the encapsulant has an operating temperature greater than 175° C.

7. The semiconductor package of claim 1, wherein the encapsulant has an operating temperature of 200° C. or higher.

8. The semiconductor package of claim 1, wherein the semiconductor die is a lateral power semiconductor die having a single source pad, a single drain pad and a single gate pad at the first side of the lateral power semiconductor die, wherein the single source pad is attached to a first one of the contact structures at the first side of the carrier, wherein the single drain pad is attached to a second one of the contact structures at the first side of the carrier, and wherein the single gate pad is attached to a third one of the contact structures at the first side of the carrier.

9. The semiconductor package of claim 8, wherein the carrier is a lead frame, wherein the first one of the contact structures is a first lead of the lead frame, wherein the second one of the contact structures is a second lead of the lead frame, and wherein the third one of the contact structures is a third lead of the lead frame.

10. The semiconductor package of claim 1, wherein the semiconductor die is a lateral power semiconductor die having a plurality of source pads, a plurality of drain pads and a gate pad at the first side of the power semiconductor die, wherein the plurality of source pads are attached to a first group of the contact structures at the first side of the carrier, wherein the plurality of drain pads are attached to a second group of the contact structures at the first side of the carrier, and wherein the gate pad is attached to an additional one of the contact structures at the first side of the carrier.

11. The semiconductor package of claim 10, wherein the carrier is a circuit board having a patterned metal layer at the first side of the circuit board and that forms the first group of the contact structures, the second group of the contact structures, and the additional one of the contact structures.

12. The semiconductor package of claim 10, wherein the lateral power semiconductor die is a lateral GaN power semiconductor die.

13. The semiconductor package of claim 1, wherein the carrier provides signal routing between the first side and the second side of the carrier.

14. The semiconductor package of claim 13, wherein the carrier is a circuit board having a patterned metal layer at the first side of the circuit board and that forms the plurality of contact structures.

15. The semiconductor package of claim 14, wherein the circuit board has a patterned metal layer at the second side of the circuit board that is patterned differently than the patterned metal layer at the first side of the circuit board, and wherein the patterned metal layer at the second side of the circuit board accommodates a land pattern of a circuit board to which the semiconductor package is to be attached.

16. The semiconductor package of claim 1, further comprising metal connectors attached to the metal plate at a side of the metal plate attached to the semiconductor die, wherein the metal connectors are laterally spaced apart from both the semiconductor die and the carrier, and wherein the metal connectors have a height that is equal to or greater than a combined height of the semiconductor die and the carrier.

17. A method, comprising:
providing a carrier sheet having a plurality of carriers interconnected to one another, each one of the carriers having a first side and a second side opposite the first side, the first side having a plurality of contact structures;
attaching a semiconductor die to each one of the carriers, each semiconductor die having a first side and a second side opposite the first side, the first side of each semiconductor die having a plurality of pads attached to the plurality of contact structures at the first side of the corresponding carrier;

after attaching the semiconductor dies, singulating the carrier sheet into separate partial packages, each one of the partial packages including one of the carriers and the semiconductor die attached to that carrier;

attaching a metal sheet to the second side of the semiconductor dies of the partial packages, the partial packages being interconnected by the metal sheet;

dispensing an encapsulant onto the metal sheet and around an edge of each one of the semiconductor dies;

curing the encapsulant; and severing the metal sheet between adjacent ones of the semiconductor dies to form whole semiconductor packages, each one of the whole semiconductor packages having a metal plate severed from the metal sheet and having a size that is independent of the size of the carrier included in the whole semiconductor package and based on an expected thermal load to be presented by the semiconductor die included in the whole semiconductor package.

18. A semiconductor package, comprising:

a carrier having a first side and a second side opposite the first side, the first side having a plurality of contact structures;

a vertical power semiconductor die having a first side and a second side opposite the first side, the first side of the vertical power semiconductor die having a source pad attached to one or more first ones of the contact structures at the first side of the carrier and a gate pad attached to a second one of the contact structures at the first side of the carrier, the second side of the vertical power semiconductor die having a drain pad;

a substrate having a first patterned metallization at a first side of an electrically insulating substrate and a second patterned metallization at a second side of the electrically insulating substrate opposite the first side, the first patterned metallization being attached to the drain pad at the second side of the vertical power semiconductor die, the substrate having a size that is independent of the size of the carrier and based on an expected thermal load to be presented by the vertical power semiconductor die;

an encapsulant confined by the carrier and the substrate and laterally surrounding an edge of the vertical power semiconductor die; and metal connectors attached to the first patterned metallization of the substrate, wherein the metal connectors are laterally spaced apart from both the vertical power semiconductor die and the carrier, wherein the metal connectors have a height that is equal to or greater than a combined height of the vertical power semiconductor die and the carrier.

19. A semiconductor package, comprising:

a carrier having a first side and a second side opposite the first side, the first side having a plurality of contact structures;

a semiconductor die having a first side and a second side opposite the first side, the first side of the semiconductor die having a plurality of pads attached to the plurality of contact structures at the first side of the carrier;

a metal plate attached to the second side of the semiconductor die;

metal connectors attached to the metal plate at a side of the metal plate attached to the semiconductor die; and an encapsulant confined by the carrier and the metal plate and laterally surrounding an edge of the semiconductor die, wherein a dimension of the metal plate in a first direction of a two-dimensional plane parallel to the metal plate and the carrier is greater than a dimension of the carrier in the first direction, wherein a dimension of the metal plate in a second direction in the two-dimensional plane perpendicular to the first dimension is greater than or less than a dimension of the carrier in the second direction, wherein the metal connectors are laterally spaced apart from both the semiconductor die and the carrier, wherein the metal connectors have a height that is equal to or greater than a combined height of the semiconductor die and the carrier.

\* \* \* \* \*